(12) United States Patent  (10) Patent No.: US 7,897,469 B2
Surdeanu  (45) Date of Patent: Mar. 1, 2011

(54) IMPACT IONIZATION MOSFET METHOD

(75) Inventor: Radu Surdeanu, Roosbeek (BE)

(73) Assignee: NXP B.V., Eindhoven (NL)

( * ) Notice: Subject to any disclaimer, the term of this patent is extended or adjusted under 35 U.S.C. 154(b) by 115 days.

(21) Appl. No.: 12/521,963

(22) PCT Filed: Dec. 12, 2007

(86) PCT No.: PCT/IB2007/055352

§ 371 (c)(1),
(2), (4) Date: Jul. 1, 2009

(87) PCT Pub. No.: WO2008/084364

PCT Pub. Date: Jul. 17, 2008

(65) Prior Publication Data

US 2010/0041186 A1   Feb. 18, 2010

(30) Foreign Application Priority Data

Jan. 5, 2007  (EP) .................................. 07100168

(51) Int. Cl.
H01L 21/336 (2006.01)

(52) U.S. Cl. ................................ 438/286; 257/E21.409

(58) Field of Classification Search ................. 438/286, 438/306; 257/E21.433, E29.268, E29.279
See application file for complete search history.

(56) References Cited

U.S. PATENT DOCUMENTS 5,959,337 A * 9/1999 Gardner et al. .............. 257/410
6,153,534 A   11/2000 Long et al.
6,967,363 B1  11/2005 Buller
2004/0089890 A1  5/2004 Burnett
2005/0116293 A1  6/2005 Goldbach et al.
2006/0202254 A1* 9/2006 Lai et al. .................... 257/315

FOREIGN PATENT DOCUMENTS

JP   08 321613 A   12/1996

OTHER PUBLICATIONS

Choi, Woo Young, et al; "80nm Self-Aligned Complementary I-MOS Using Double Sidewall Spacer and Elevated Drain Structure and Its Applicability to Amplifiers With High Linearity"; EEMD 04-203; pp. 8.5.1-8.5.4, Dec. 2004.
Gopalakrishnan, Kailash, et al; "Impact Ionization MOS (I-MOS)—Part II: Experimental Results"; IEEE Transactions on Electron Devices; vol. 52. No. 1; Jan. 2006; p. 77-84.
Choi, Woo Young, et al; "100nm n-/p-Channel I-MOS Using a Novel Self-Aligned Structure"; IEEE Electron Device Letters; vol. 26, No. 4 Apr. 2005; pp. 261-263.
Choi, Woo Young, et al; "A New Fabrication Method for Self-Aligned Nanoscale I-MOS (Impact-Ionization MOS)"; pp. 211-212; Device Research Conference 2004; IEEE Cat No. 04TH8724; IEEE; Piscataway, NJ, US.

* cited by examiner

Primary Examiner—Khiem D Nguyen
Assistant Examiner—Daniel Shook

(57) ABSTRACT

A method of manufacturing an I-MOS device includes forming a semiconductor layer (2) on a buried insulating layer (4). A gate structure (23) including a gate stack (14) is formed on the semiconductor layer, and used to (5) self align the formation of a source region (28) by implantation. Then, an etch step is used to selectively etch the gate structure (23) and this is followed by forming a drain region (36) by implantation. The method can precisely control the i-region length (38) between source region (28) and gate stack (14).

7 Claims, 6 Drawing Sheets

IMPACT IONIZATION MOSFET METHOD

Figure 1:
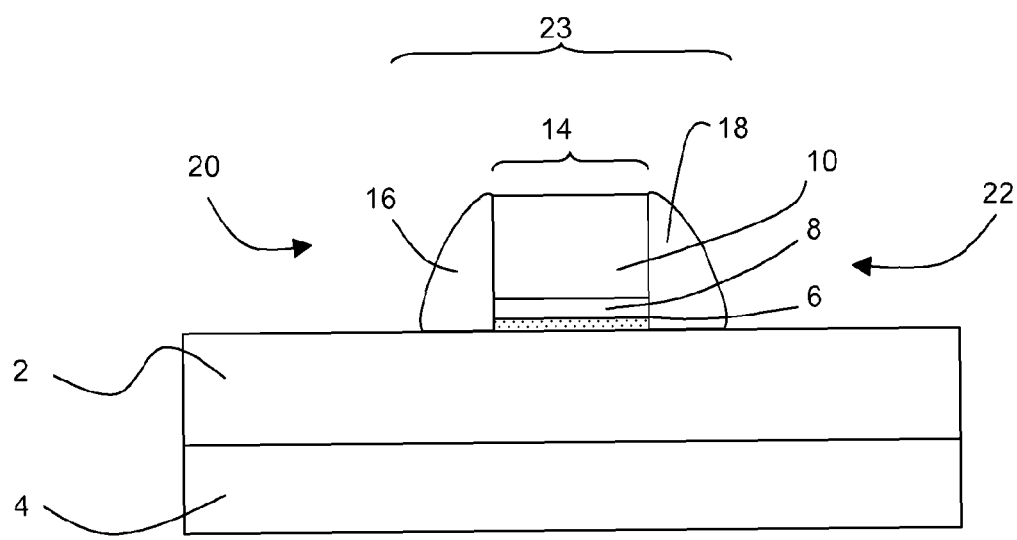

The invention relates to an impact ionization MOSFET and a method of making it.

As the scale of conventional CMOS (complementary metal oxide semiconductor) transistors enters the nm regime, the physical limit of the subthreshold slope of 60 mV/decade represents a fundamental problem.

For this reason, a new type of device, known as Impact-Ionization MOS, is attracting attention since it can give a subthreshold slope of 5 mV/decade. These devices have the source and drain doped to be of different conductivity type, one N and one P and this makes manufacture considerably more difficult than conventional CMOS devices especially at nm scales.

Choi et al describe one rather complicated I-MOS manufacturing method in 80 nm Self-Aligned Complementary I-MOS Using Double Sidewall Spacer and Elevated Drain Structure and Its Applicability to Amplifiers with High Linearity, published in the proceedings of the IEDM 2004 pages 203 to 206.

Another, slightly simpler method is described in Gopalakrishnan et al in Impact Ionization MOS (I-MOS)—Part II: Experimental results, IEEE transactions on electron devices, Vol 52, No. 1, January 2005.

According to an example embodiment, there is a method of manufacturing an Impact Ionization Metal Oxide Silicon device (I-MOS). The method comprises providing a semiconductor layer on a buried insulating layer. A gate structure including a stack of gate dielectric and polysilicon gate on the semiconductor layer is formed. The gate structure has opposed first and second sides. On the second side of the gate structure the semiconductor layer is masked with resist. Implantation of a first conductivity type is carried out to dope a first region on the first side of the stack. The resist is removed. The gate structure is selectively etched away to leave the stack spaced from the first region. With resist, on the first side of the gate structure, the semiconductor layer is masked. Implantation with a second conductivity type opposite the first conductivity type, to dope a second region of the semiconductor layer on the second side of the stack and adjacent to the stack, is carried out.

The method can readily deliver an I-MOS device with a precise control of the i-region length between the source region and the gate and with the drain region accurately self-aligned to the gate.

This method is fully self aligned, in other words both source and drain implantations are self-aligned. This is an advantage over the approach of Choi et al, which uses a non-self aligned lithography step, and Gopalakrishnan et al, which uses two non-self aligned lithography steps. Thus, these prior art approaches require much more accurate masking for the implantation steps greatly increasing the difficulty and cost of those approaches.

In Choi et al there is a triple sidewall spacer. Since each spacer formation requires an etch step, the method of Choi et al will remove some dopants from the already implanted area greatly affecting device performance. In contrast, the method of the invention avoids the need to deposit spacers over an already implanted area.

In one approach, the gate structure includes spacers on both first and second sides of the stack; and the step of selectively etching away the gate structure includes carrying out a tilted implantation on the second side of the stack; and carrying out an HF wet etch on the spacer to remove the spacer from the second side of the stack leaving the spacer on the first side of the stack.

In another approach, the method includes the step of carrying out a nitrogen implantation on the second side of the stack before the step of masking the semiconductor layer. In this approach, the step of selectively etching away the gate structure includes carrying out an oxidation step on the stack to preferentially oxidise the first side of the stack without the nitrogen implantation; and carrying out a wet etch to preferentially etch away the stack on the first side.

For a better understanding of the invention, embodiments will now be described, purely by way of example, with reference to the accompanying drawings, in which:

FIGS. 1 to 6 show side views of steps in a method according to a first embodiment of the invention; and FIGS. 7 to 12 show side views of steps in a method according to a second embodiment of the invention.

The figures are purely schematic and not to scale. The same or similar components are given the same reference numerals in the different Figures.

Referring to FIG. 1, a semiconductor layer 2 is provided over a buried insulating layer 4, in this example a buried oxide layer 4. In the embodiment the semiconductor layer 2 is of silicon but this is not essential and the method does not require any particular semiconductor material to work.

A number of layers are then deposited, including a high-k gate dielectric layer 6, a metal gate layer 8 on the gate dielectric layer 6 and a polysilicon gate layer 10 on the metal gate layer 8. These are then patterned, for example by using a hard mask, patterning the hard mask, and then using the hard mask as a mask to etch the layers to form gate stack 14. The hard mask can then be removed. Alternative approaches to patterning the gate stack 14 may also be used.

A first spacer 16 and a second spacer 18 are then formed on the first 20 and second 22 sides of the gate stack 14 to arrive at the gate structure 23 shown in FIG. 1. The spacer can be formed under precise control so the width of the spacer can be precisely defined. The spacer width may be in the range 15 to 200 nm. This width determines the i-region length $L_I$ in the finished device which is thus also precisely defined.

The gate stack 14 and spacers 16,18 will be referred to as the gate structure 23.

Figure 2:
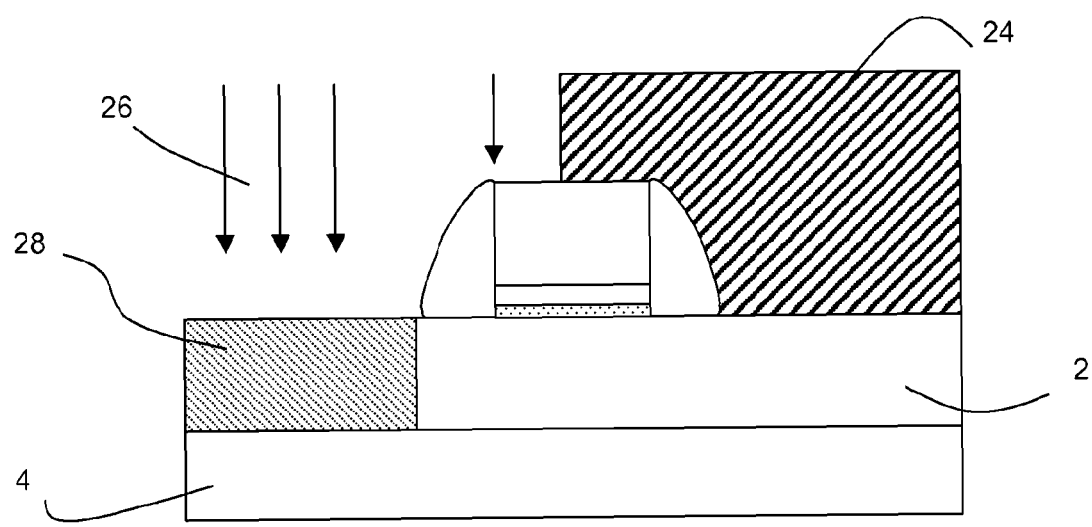
Figure 3:
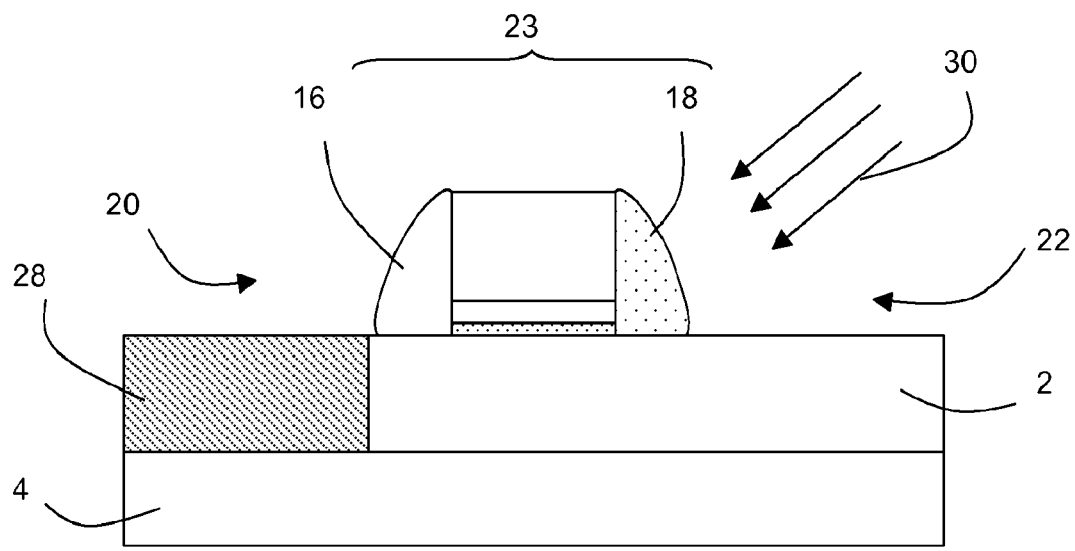

Next, resist 24 is deposited and patterned to cover the semiconductor layer 2 on the second side 22 of the gate stack, leaving the first side 20 exposed. An ion implantation step of boron 26 with dose up to $1.5 \times 10^{15}$ cm$^{-2}$ is used to implant the p-type source region 28, as shown in FIG. 2. The spacers 16, 18 mean that the accuracy of the resist pattern is not critical since the edge of the resist 26 falls on the gate stack 14 or one of the spacers. Therefore, lithography with achievable accuracy of for example 20 nm is acceptable.

It should be noted that the use of a polysilicon 10/metal 8/dielectric 6 stack means that the dopant in the polysilicon 10 is not critical since the gate to semiconductor interface is determined by metal 8 and hence nothing is changed in the device whether or not the polysilicon is doped n-type or p-type. Thus, the possibility of doping the polysilicon 10 of the gate does not degrade the device properties.

The resist 24 is then removed and a tilted implantation of Ar or Xe ions 30 is then used to implant Ar or Xe in the second spacer 18 on the second side 22 of the gate stack. The gate structure 23 itself shields the first spacer 16 from the implant. The implant in the example has a tilt angle of 45° from the perpendicular to the semiconductor layer 2 and a dose of $10^{15}$ cm$^{-2}$. Suitable tilt angles are in the range 15° to 75°, preferably 30° to 60°.

Figure 4:
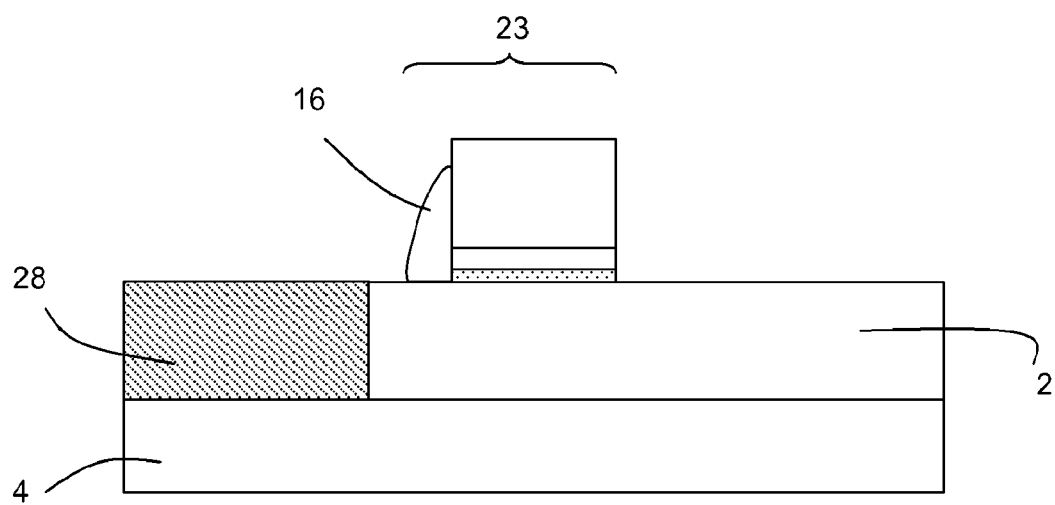

Then, a wet etch is used to etch the oxide spacer. In the embodiment, a 0.3% solution of HF is used. The implanted second spacer 18 is etched at a rate double, or more, than the non-implanted first spacer 16, and the etch is continued for a time sufficient to completely etch away the second spacer 18 leaving part of the first spacer 16 as illustrated in FIG. 4. The thickness of the remaining first spacer is preferably at least 10 nm.

Figure 5:
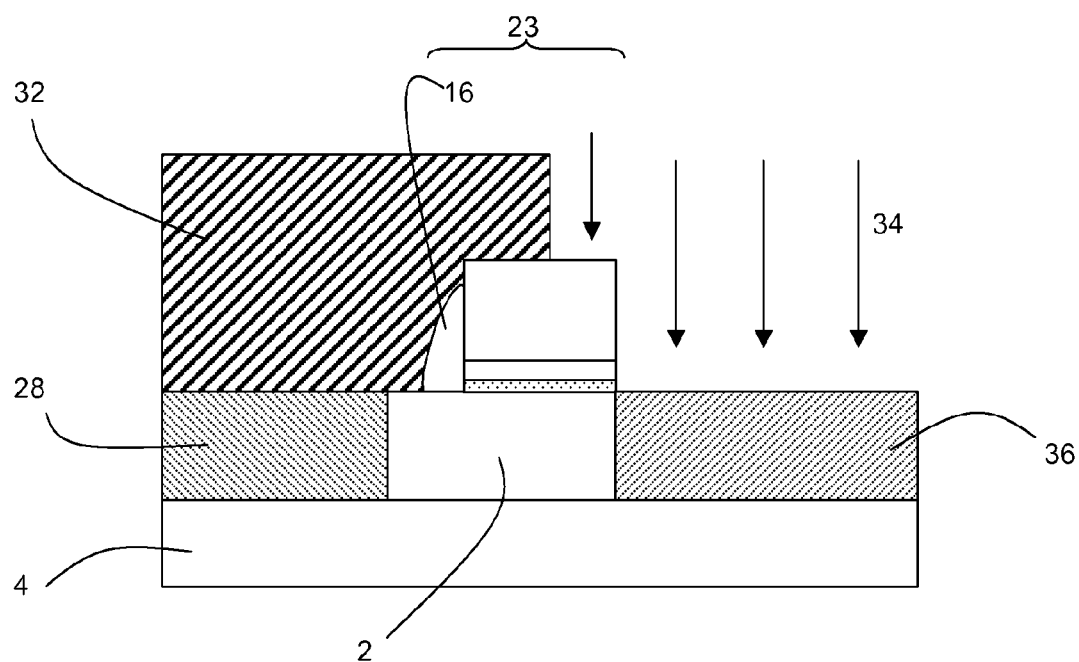

A resist 32 is then used to cover the exposed semiconductor layer 2 on the first side 20 of the stack 14. An ion implantation step is then used to dope the semiconductor layer 2 on the second side 22 of the stack 14 n+, using P or As ion implantation 34, to form the drain region 36 as illustrated in FIG. 5. The dose can be up to $1.5 \times 10^{15}$ cm$^{-2}$.

As in the earlier implantation step, the exact location of the edge of the resist is not critical so long as it is over the gate structure 23, now made up of the gate stack 14 and the remaining first spacer 16.

Figure 6:
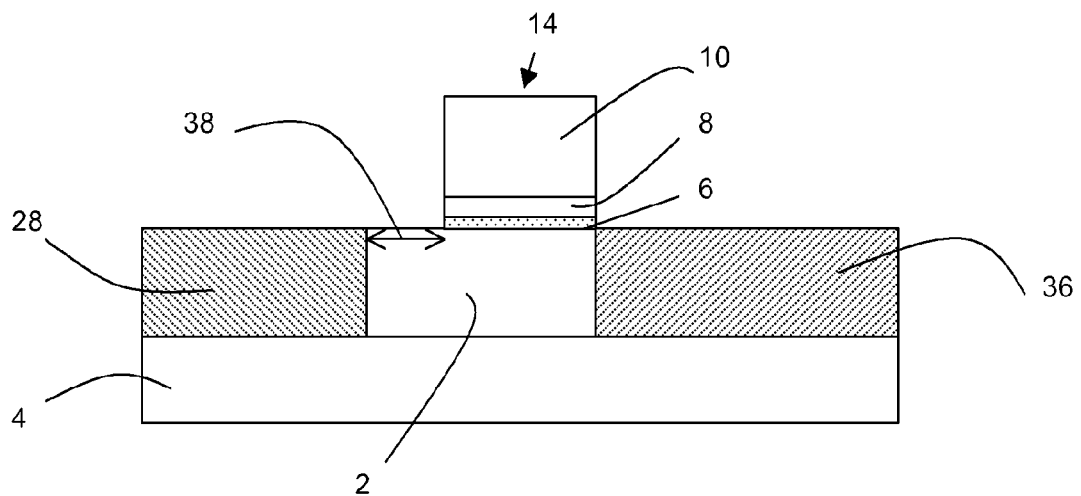

The resist 32 can then be removed and if necessary the remaining first spacer 16 as shown in FIG. 6. The i-region length 38 between the source and the gate is precisely defined by the spacer width and so can be accurately controlled.

An alternative process will now be described with reference to FIGS. 7 to 12.

Figure 7:
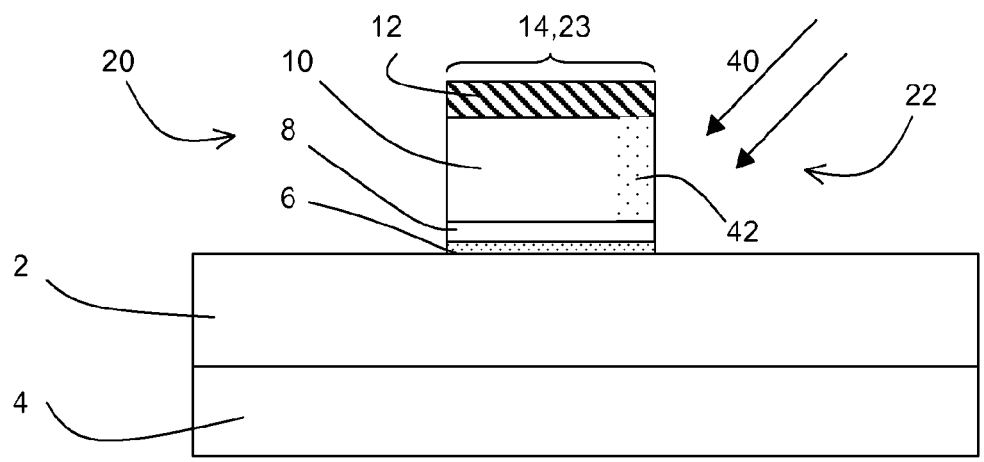
Figure 8:
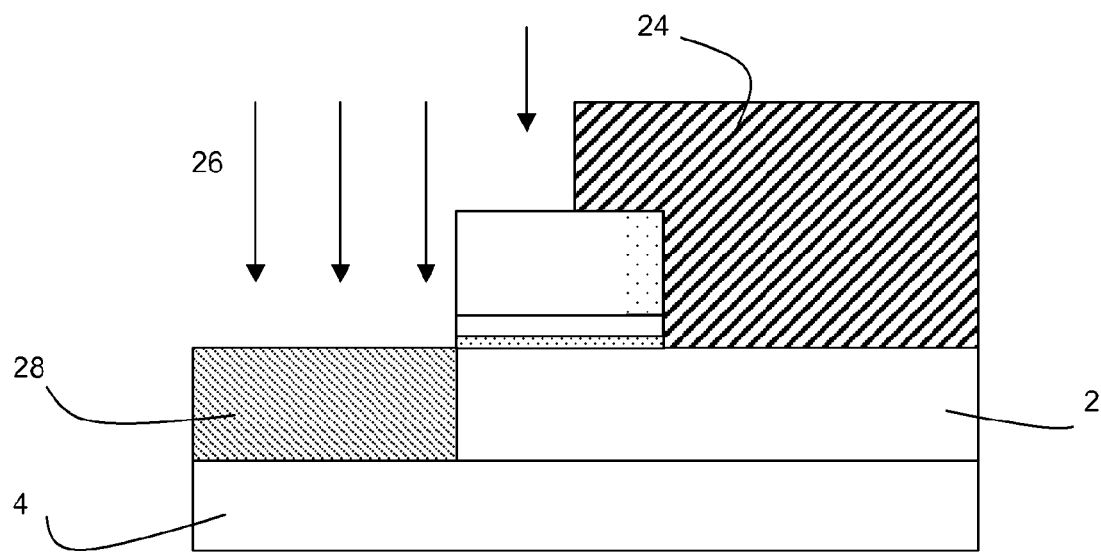

Referring to FIG. 7, a semiconductor layer 2 is provided over a buried oxide layer 4.

A number of layers are then deposited, including a high-k gate dielectric layer 6, a metal gate layer 8 on the gate dielectric layer 6 and a polysilicon gate layer 10 on the metal gate layer 8. These are then patterned, for example by using a hard mask 12, patterning the hard mask, and then using the hard mask as a mask to etch the layers to form gate stack 14. In this embodiment, the hard mask layer 12 is retained as shown in FIG. 7. The stack has opposed first and second sides 16, 18. In this embodiment, the gate structure 23 is simply the gate stack 14.

A nitrogen implantation is then carried out implanting nitrogen 40 on the second side 18 of the stack using a tilted implantation process to form a nitrogen implanted region 42 on the second side 18 of the stack.

The hard mask 12 is then removed and a resist 24 provided to protect the semiconductor layer 2 on the second side 22 of the gate stack 14. A p+ type source region 28 is formed by implantation of boron 26 as in the first embodiment resulting in the structure illustrated in FIG. 8.

By removing the hard mask before the boron implant the risk that the hard mask might remove the implanted dopants close to the interface is minimised. However, in alternative arrangements the hard mask can also be removed after the boron implants.

Figure 9:
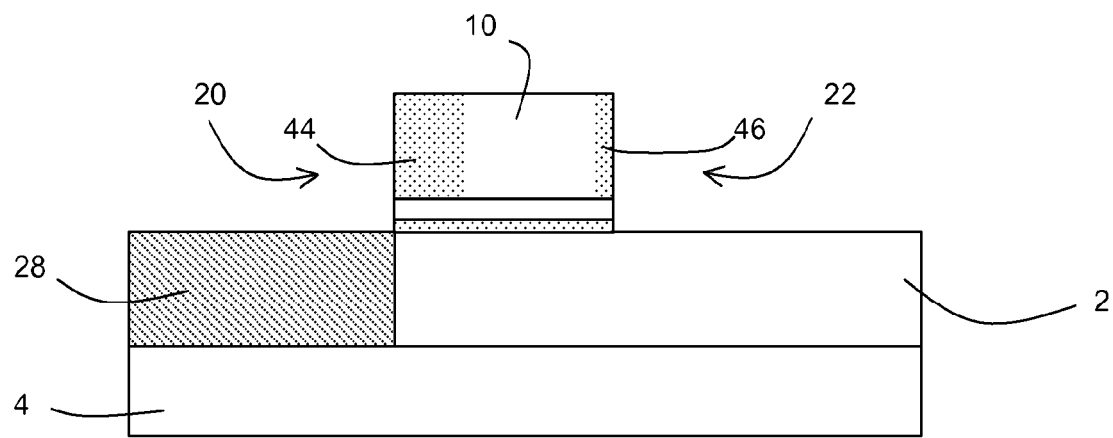
Figure 10:
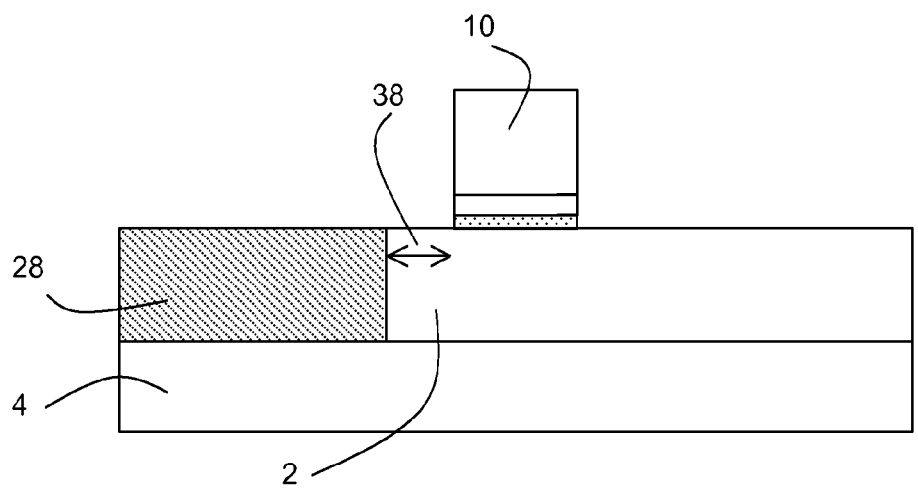

An oxidation step is then carried out to oxidise the polysilicon gate layer 10 to form first and second oxidized regions 44, 46 on the first and second sides 20,22 respectively. The nitrogen implanted region 42 on the second side 18 is oxidized less rapidly than the polysilicon on the first side so the first oxidized region 44 is thicker than the second oxidized region 46, as illustrated in FIG. 9.

A wet etch is then carried out with 0.3% HF to remove the oxidized regions 44, 46. A further etch step is then used to etch the metal layer 8 from under the removed oxidized regions 44,46 leaving the structure of FIG. 10 with a precisely controlled spacing 38 between the source region 28 and the gate stack 14. With careful control, nm resolution of this spacing can be obtained.

Note that the removal of the oxidized regions 44,46 is, in an alternative process, not total, and in this case the remaining part of the oxidized regions 44,46 can be used as an offset spacer for source and/or drain extensions.

Figure 11:
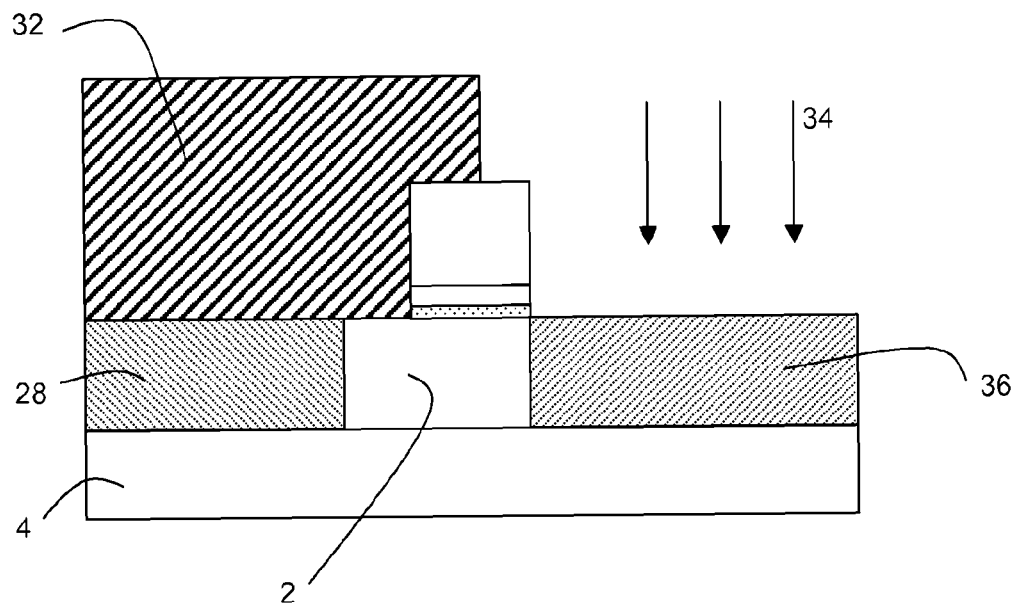

Resist 32 is then used to mask the semiconductor layer 2 on the first side 20 of the stack, and Ar or P ions 34 are used to implant the n+ type drain region 36 in the semiconductor layer 2 on the second side 22 as in the first embodiment. This step is illustrated in FIG. 11.

Figure 12:
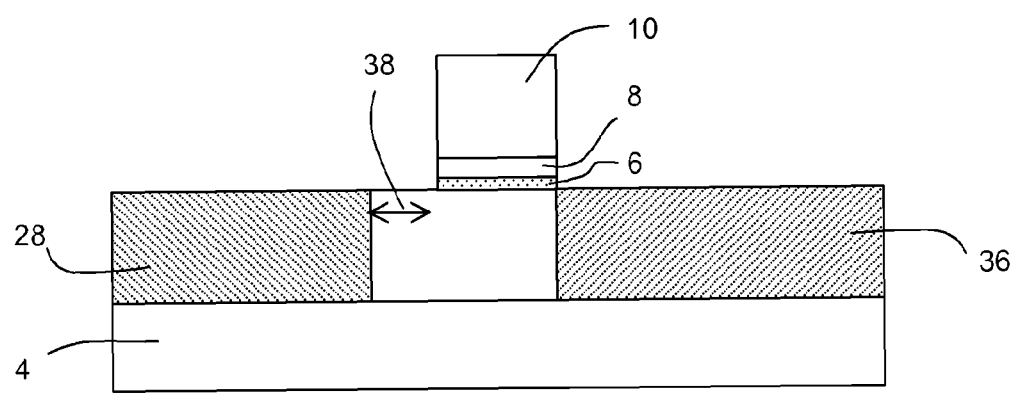

The resist 32 is then removed, leaving the structure of FIG. 12.

Processing can then continue to complete a chip as required using conventional processing steps. Since these will be familiar to those skilled in the art, they will not be described further here.

The method of either embodiment is a scalable and highly accurate self-aligned fabrication method for an I-MOS allowing the fabrication of an I-MOS device with very small gate lengths. The resulting device, has a minimal sub-threshold slope of 5 nm/decade. The i-region length can be controlled very exactly and the method works with short gate lengths as low, for example, as 20 nm, or even 10 nm or 5 nm and up.

The method can be used with a variety of high-k gate dielectrics and gate metals as required and so is of general applicability.

The method is easy to implement on semiconductor layers 2 other than Si, for example GaAs, Ge, SiGe, etc.

The method is also easy to implement in a standard CMOS devices allowing I-MOS devices to be combined on a die with standard CMOS.

It will be noted that the process is considerably simpler than those used in the prior art referred to above whilst providing very accurate control.

The invention claimed is:

1. A method of manufacturing an Impact Ionization Metal Oxide Silicon device (I-MOS), comprising:
    providing a semiconductor layer on a buried insulating layer;
    forming a gate structure including a stack of gate dielectric and polysilicon gate on the semiconductor layer, the gate structure having opposed first and second sides;
    masking the semiconductor layer on the second side of the gate structure with a first resist;
    carrying out an implantation to dope a first region on the first side of the stack a first conductivity type;
    removing the first resist;
    selectively etching away the gate structure to leave the stack spaced from the doped first region;
    masking the semiconductor layer on the first side of the gate structure with a second resist; and
    carrying out an implantation to dope a second region of the semiconductor layer on the second side of the stack and abutted to the stack a second conductivity type opposite to the first conductivity type.

2. A method according to claim 1 wherein selectively etching away the gate structure includes an HF wet etch.

3. A method according to claim 1 further comprising the step of carrying out a nitrogen implantation to create a nitrogen implanted region on the second side of the stack before the step of masking the semiconductor layer;
    wherein the step of selectively etching away the gate structure includes carrying out an oxidation step on the stack to form first and second oxide layers on the respective first and second sides of the stack, wherein the thickness of the first oxide layer is thicker than the thickness of the second oxide layer; and
    carrying out a wet etch to etch away oxide layers.

4. A method according to claim 2 wherein the gate structure includes first and second spacers on respective first and second sides of the stack; and
    the step of selectively etching away the gate structure includes carrying out a tilted implantation on the second side of the stack; and carrying out the HF wet etch on the first and second spacers to remove the second spacer from the second side of the stack leaving at least part of the first spacer on the first side of the stack.

5. A method according to claim 4 wherein the tilted implantation is a tilted implantation of Argon or Xenon at an angle between 15° to 75° to the normal to the semiconductor layer.

6. A method according to claim 3 wherein the stack includes a gate dielectric, a metal gate layer on the gate dielectric and a polysilicon gate layer on the metal gate layer, and wherein the step of carrying out a wet etch includes carrying out an HF wet etch followed by an etch to remove the metal gate layer where it is exposed by the HF wet etch.

7. A method according to claim 3 wherein the step of carrying out a nitrogen implantation is carried out at a tilted angle of 15° to 75° to the normal to the semiconductor layer.

* * * * *